United States Patent [19]

Draney

[11] Patent Number: 4,829,446

[45] Date of Patent: May 9, 1989

[54] METHOD AND APPARATUS FOR RECORDING AND REARRANGING REPRESENTATIONS OF OBJECTS IN A MODEL OF A GROUP OF OBJECTS LOCATED USING A CO-ORDINATE SYSTEM

[75] Inventor: Marlow R. Draney, Orem, Utah

[73] Assignee: Caeco, Inc., Orem, Utah

[21] Appl. No.: 940,774

[22] Filed: Dec. 12, 1986

[51] Int. Cl.[4] .................. G06F 15/60; G06F 15/40
[52] U.S. Cl. .................... 364/488; 340/723; 364/491; 364/518; 382/44
[58] Field of Search ............ 364/300, 488, 489, 490, 364/491, 518, 521, 522; 340/723, 724, 731; 382/47, 48, 49, 44

[56] References Cited

U.S. PATENT DOCUMENTS

| | | | |
|---|---|---|---|
| 4,484,347 | 11/1984 | Kashioka | 382/47 |
| 4,513,438 | 4/1985 | Graham et al. | 382/44 |
| 4,545,070 | 10/1985 | Miyagawa et al. | 340/723 |
| 4,554,625 | 11/1985 | Otten | 364/491 |
| 4,581,710 | 4/1986 | Hasselmeier | 364/523 |
| 4,630,219 | 12/1986 | DiGiacomo et al. | 364/488 |
| 4,656,603 | 4/1987 | Dunn | 364/488 |
| 4,675,830 | 6/1987 | Hawkins | 364/523 |
| 4,686,629 | 8/1987 | Noto et al. | 364/488 |
| 4,698,779 | 10/1987 | Holden et al. | 364/522 |
| 4,700,317 | 10/1987 | Watanabe et al. | 364/488 |
| 4,703,321 | 10/1987 | Barker et al. | 340/724 |

OTHER PUBLICATIONS

Solid State Tech., Nov. 1979, "An Approach to Computer-Aided Design of Multilayer Hybrids", J. R. Sims et al., pp. 90-96.

*Primary Examiner*—Parshotam S. Lall
*Assistant Examiner*—Kevin J. Teska
*Attorney, Agent, or Firm*—Hale and Dorr

[57] ABSTRACT

The invention is a method and an apparatus for recording geometries as representations of objects, located using a coordinate system. A record is created that may be altered to change the locations of geometries with respect to the coordinate system and the record of the locations of other geometries is automatically changed so that the locations of the geometries first altered do not conflict with the locations of the other geometries. The invention accomplishes the objective by recording the locations of certain geometries (relative geometries) relative to the locations of certain other geometries (located geometries). The location of at least one locater geometry is designated. The location of the locator geometry is recorded in a datafile. The location of a relative geometry is designated relative to a previously located locater geometry. The relative location of the relative geometry is recorded in an instruction file, and the location of the relative geometry with respect to the coordinate system is recorded in the datafile. There may be more than one relative geometry. The geometries may be defined by points, such as vertices of polygons. In that case, the location of selected vertices defining the relative geometery may be defined relative to selected vertices in locater geometries.

38 Claims, 12 Drawing Sheets

| TABLE INDEX | SERIES GEOMETRY NO. | O-PATH NO. | VERTEX NO. | ABSOLUTE X VALUE | ABSOLUTE Y VALUE | FLAG | PDF NO. |
|---|---|---|---|---|---|---|---|
| 1 | 1 | 1 | 1 | 10 | 20 | 3 | 9 |
| 2 | 1 | 1 | 2 | 1 | 20 | 3 | 9 |
| 3 | 1 | 1 | 3 | 1 | 10 | 3 | 9 |
| 4 | 1 | 1 | 4 | 10 | 10 | 3 | 9 |
| 5 | 2 | 1 | 1 | 10 | 9 | 3 | 9 |
| 6 | 2 | 1 | 2 | 1 | 9 | 3 | 9 |
| 7 | 2 | 1 | 3 | 1 | 7 | 3 | 9 |
| 8 | 2 | 1 | 4 | 7 | 7 | 3 | 9 |
| 9 | 2 | 1 | 5 | 7 | 3 | 3 | 9 |
| 10 | 2 | 1 | 6 | 20 | 3 | 3 | 9 |
| 11 | 2 | 1 | 7 | 20 | 5 | 3 | 9 |
| 12 | 2 | 1 | 8 | 10 | 5 | 3 | 9 |
| 13 | 3 | 1 | 1 | 12 | 17 | 3 | 9 |
| 14 | 3 | 1 | 2 | 12 | 8 | 3 | 9 |
| 15 | 3 | 1 | 3 | 20 | 8 | 3 | 9 |
| 16 | 3 | 1 | 4 | 20 | 17 | 3 | 9 |

*FIG. 9A*

| TABLE INDEX | SERIES GEOMETRY NO. | O-PATH NO. | VERTEX NO. | ABSOLUTE X VALUE | ABSOLUTE Y VALUE | FLAG | PDF NO. |
|---|---|---|---|---|---|---|---|
| 1 | 1 | 1 | 1 | 19 | 20 | 3 | 9 |
| 2 | 1 | 1 | 2 | 1 | 20 | 3 | 9 |
| 3 | 1 | 1 | 3 | 1 | 10 | 3 | 9 |
| 4 | 1 | 1 | 4 | 19 | 10 | 3 | 9 |
| 5 | 2 | 1 | 1 | 10 | 9 | 3 | 9 |
| 6 | 2 | 1 | 2 | 1 | 9 | 3 | 9 |
| 7 | 2 | 1 | 3 | 1 | 7 | 3 | 9 |
| 8 | 2 | 1 | 4 | 7 | 7 | 3 | 9 |
| 9 | 2 | 1 | 5 | 7 | 3 | 3 | 9 |
| 10 | 2 | 1 | 6 | 20 | 3 | 3 | 9 |
| 11 | 2 | 1 | 7 | 20 | 5 | 3 | 9 |
| 12 | 2 | 1 | 8 | 10 | 5 | 3 | 9 |
| 13 | 3 | 1 | 1 | 21 | 17 | 3 | 9 |
| 14 | 3 | 1 | 2 | 21 | 8 | 3 | 9 |
| 15 | 3 | 1 | 3 | 29 | 8 | 3 | 9 |
| 16 | 3 | 1 | 4 | 29 | 17 | 3 | 9 |

METHOD AND APPARATUS FOR RECORDING AND REARRANGING REPRESENTATIONS OF OBJECTS IN A MODEL OF A GROUP OF OBJECTS LOCATED USING A CO-ORDINATE SYSTEM

BACKGROUND OF THE INVENTION

This invention relates generally to the field of computer aided design of systems modeled by groups of objects located using a coordinate system and displayed, typically, on a computer monitor screen. As used below, "object" shall refer to an actual, real thing, including a zone of semi-conductor material, a printed logic symbol, a printed flow-chart box, a door or window in an architectural layout, etc. "Geometry" shall refer to a model or representation of an object located in a coordinate system. The model may be, for example, a data structure maintained in computer RAM or non-volatile memory. "Geometry" shall also refer to a representation of the object on a computer screen. In particular, the invention relates to a method and an apparatus for recording and automatically modifying the representation of geometries within the data structure, so that upon changing the size, shape, orientation or location of one geometry, other geometries automatically relocate to maintain preselected spatial relationships with the modified geometry, and with other geometries modified as a result of the modification to the first geometry.

Designers of different sorts of layouts now often use computers to aid the design. This type of design is known as "CAD" for "computer aided design". The term "CAE" refers to the related field of "computer aided engineering". Designers use CAE tools frequently in designing layouts for printed circuit boards, logic circuits, semiconductor chips, semiconductor mask-works, very large scale integrated circuits ("VLSI's"), architectural layouts, etc.

Typically, these tools accept input from the designer, either as cursor key strokes and/or mouse motions, or as a data file. The user's inputs define a growing group of geometries. Representations of the geometries are displayed on a computer screen as rectangles, circles, polygons, standard logic shapes, etc. Users of these CAE tools face problems when they want to change the size, shape, orientation or location of a geometry. In known devices, the data record described and keeps track of each geometry relative to the origin of a fixed coordinate system. The record(s) associated with each geometry is (are) independent of records of all other geometries. If a geometry is enlarged, so that its computer monitor representation overlaps another geometry, the user must manually move one or the other of the geometries to avoid the overlap. Similar problems can arise if the user reduces the size of the geometry, or changes the shape, orientation or location of a geometry.

In the field of semiconductor, chip design, a related and acute problem arises. Semiconductor chips are multi-layer devices, each layer including many objects, such as transistors, metal runs, load transistors and contacts. Some objects also occupy several layers, with different sized elements on each layer. In the chip design, not only must the designer insure that different elements do not collide or overlap, but the designer must also maintain minimum clearances between elements. The clearances are dictated by the physics governing the close location of very small electrical or semiconductor elements. These clearances must be maintained both between elements on the same layer, and between elements on different layers. Thus, even though change of a geometry location, etc., might not bring it into collision with another, the change might bring two geometries into an unacceptable proximity.

Many of the techniques of integrated circuit manufacture are photographic in nature. Actual hard copies of the layout are copied and reduced and then etched according to methods well known in the art. The hard copies may be generated by CAD equipment, using the same information that the designer used while designing the device. Thus, the problems encountered in designing an integrated circuit device also arise in connection with preparing the mask-works for their manufacture.

OBJECTS OF THE INVENTION

It is therefore an object of the invention to provide a method and an apparatus that permits maintaining preselected relative clearances between geometries even though some geometries are moved, enlarged, shrunken or reoriented. It is a further object of the invention to provide a method and an apparatus that permits easily testing several variations of a basic geometry layout, without having to manually replace each geometry due to relocation or alteration of one geometry upon which the locations of other geometries depend.

SUMMARY OF THE INVENTION

The method of the invention overcomes the problems of known methods by specifying the location of the geometries in the model according to both an absolute and a relative technique. The model may be stored on a permanent memory medium and may be used at a later time to generate representations of the group of objects. In this description, the permanent model will be referred to as the GEOMETRY LOCATION DATABASE. The relative positioning technique of the method features the steps of recording instructions for adding new geometries to the GEOMETRY LOCATION DATABASE according to the new geometry's relative distance from previously placed, geometries. The method features prompting the user to select the geometry or geometries from which he wishes to locate the new geometry as the user defines a new geometry. Below, points, vertices and geometries, from which other points, vertices or geometries are located, will be referred to as "locater points, vertices or geometries." Points, vertices or geometries that are located from locater points, vertices or geometries are referred to as "relative points, vertices or geometries." A geometry may also be a single point.

The user may also wish to locate a geometry relative to one of a set of locater vertices, where the chosen locater vertex has the greatest or least x or y coordinate of the set of locater vertices. The invention also provides this comparison locater vertex feature.

The method features generating a temporary table of records as the user generates instructions for creating geometries. The temporary table of records is referred to below as the GEOMETRY R-CELL VERTEX TABLE. The method features using the GEOMETRY R-CELL VERTEX TABLE to determine the locations of the relative vertices or geometries relative to the already placed locater vertices or geometries. With respect to groups of geometries bound together as a construct having geometries on multiple layers, the method features generating a GEOMETRY LOCATION DATABASE which includes all of the information necessary to generate a layer by layer graphic representation of the created construct. The graphic representation may be on a computer monitor, paper copy or mask work mask.

The apparatus of the invention for maintaining relative clearances between geometries even though some geometries are moved, enlarged, shrunken or reoriented, features an input device for accepting instructions from the user for locating geometries. The input device may include a mouse and mouse buttons, either combined with a keyboard and cursor keys, or alone. The mouse and cursor keys may be used to select items from menues of possible instructions.

The apparatus of the invention overcomes the problems of known devices by providing means for specifying the location of the geometries in the model according to both an absolute and a relative scheme. The apparatus permits specification of the location according to a relative scheme by providing means for recording instructions for adding new relative geometries to the GEOMETRY LOCATION DATABASE according to the new relative geometry's location from previously placed, selected locater geometries. When the user defines instructions for creating a new geometry, the apparatus prompts the user to select the locater vertex or geometry relative to which he wishes to locate the new geometry. The apparatus also includes circuitry that permits the comparison locater feature described above with respect to the method of the invention. The apparatus features circuitry for generating a GEOMETRY R-CELL VERTEX TABLE as the user generates instructions for creating geometries. The apparatus features means for using the GEOMETRY R-CELL VERTEX TABLE of records to compare the locations of the newly created geometries to the already located geometries relative to which the new relative geometry is located. With respect to groups of geometries located in multiple layers, the apparatus generates a GEOMETRY LOCATION DATABASE which includes all of the information necessary to generate a layer by layer graphic representation of the created groups of objects.

BRIEF DESCRIPTION OF THE FIGURES OF THE DRAWING

FIGS. 9a and b are two representations of the GEOMETRY R-CELL VERTEX TABLE data structure, used in connection with building and executing a Macro file.

The apparatus and the method of the invention will be more easily understood by reference to the foregoing figures in connection with the discussion below.

DETAILED DESCRIPTION OF A PREFERRED EMBODIMENT OF THE INVENTION

In accordance with the invention, the method and apparatus can be implemented in either hardware, software, or a combination of both. In the illustrated embodiment first discussed below, the method and apparatus of the invention have been implemented in a hardware configuration.

Figure 1A:
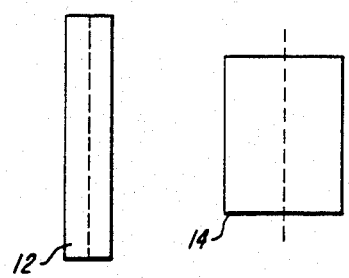
FIG. 1 comprised of FIGS. 1a–1c is a schematic representation of a simple MOS load transistor having an n+ path, a polysilicon path and a path on the buried contact layer.
Figure 1B:
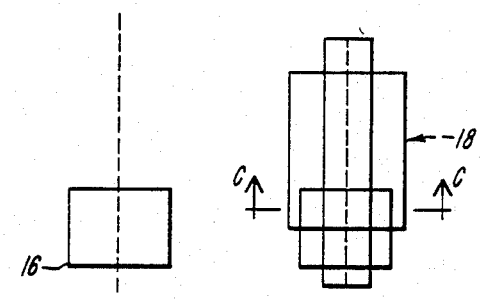
Figure 1C:
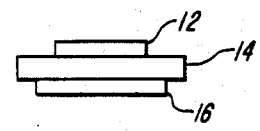
Figure 4:
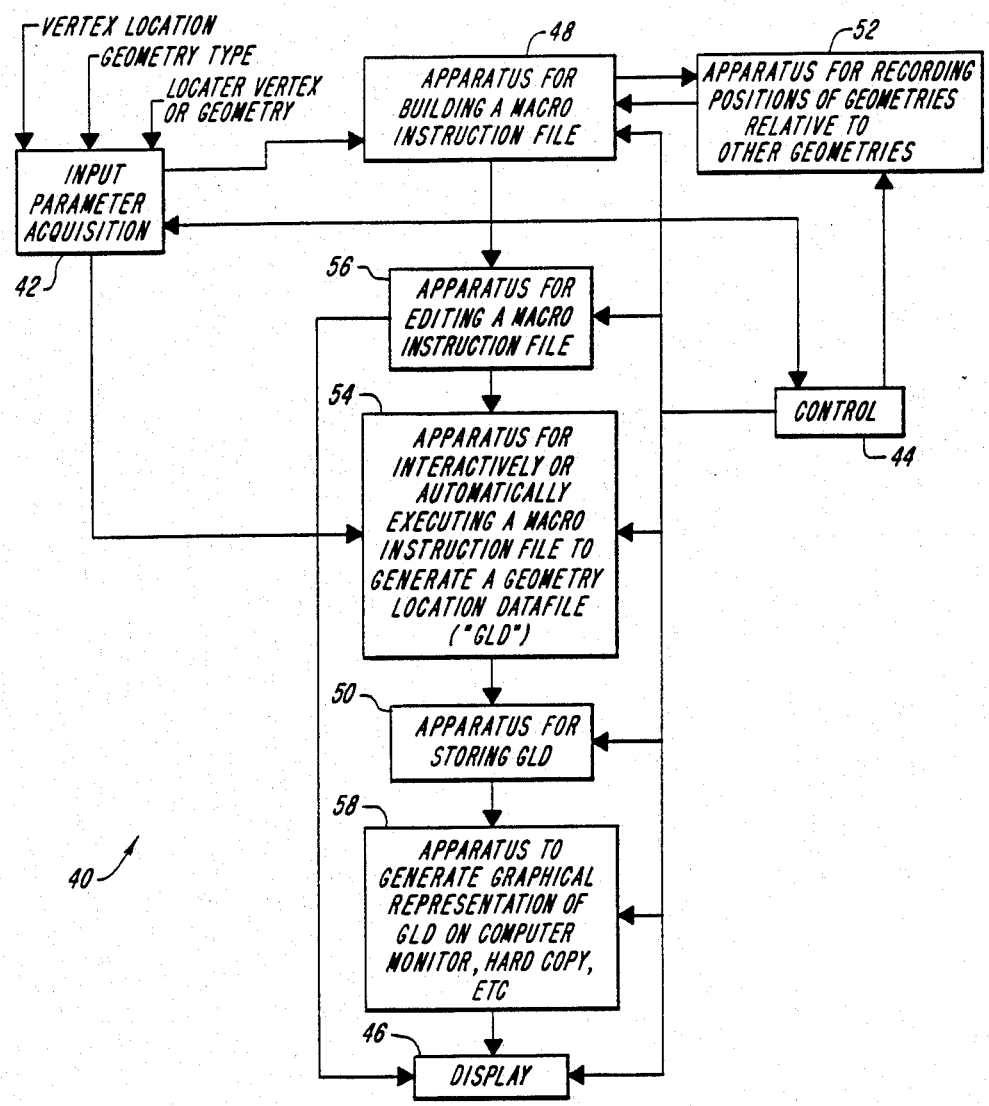
FIG. 4 is a general circuit diagram of a preferred embodiment of the apparatus of the invention.

An object of the invention is to facilitate rearranging representations of objects defined using the coordinate system and displayed, for instance, on a computer monitor. FIG. 1 is a schematic representation of a multilayer object, a MOS transistor, by a group of geometries. In FIG. 1, a rectangular geometry 12 represents the n+ layer; a geometry 14 represents the polysilicon layer of the transistor; and a geometry 16 represents the buried contact window. FIG. 1b shows each of the layers superimposed in a geometry group 18 (the object), as the transistor might be represented on a display device of the apparatus of the invention, as shown in FIG. 4. In the actual device, the layers stack upon each other, as shown in the cross-sectional view (FIG. 1c) taken along the lines c—c of FIG. 1b.

FIG. 4 shows an apparatus 40 for recording and automatically rearranging representations of objects defined using a coordinate system. The apparatus includes a device 42 for accepting input from the designer. The input device typically includes a keyboard having cursor keys for directing the location of a cursor on a computer monitor, such as a display 46. The input device also typically includes a mouse, which mouse may include several special keys for sending preselected signals to a controller 44.

The input device 42 receives input commands from the user. These commands define locations on the screen that correspond to locations in the coordinate system where the user wishes to locate points (vertices)

and geometries, commands identifying what type of a geometry the user wishes to be located at a certain location and commands identifying locater geometries or vertices from which the user wishes to locate the relative vertices and geometries. It should be noted that the user places points, but the points typically become associated into geometries defined by polygons and are thus frequently referred to below as vertices.

It is of course possible to define geometries by points and/or structures that are not vertices of polygons. For example, a circle may be defined by a central point and a radius, and a rectangle may be defined by a central point, a length and a width. The apparatus and method of the invention may be practiced by using these additional types of defining points or structures as "locater" and "relative" entities. For the purpose of simplifying illustration, the following description considers points that are vertices. The generality of the invention, however, is not so limited.

Operating under the control of a sequence processor (controller) 44, the apparatus 48 builds a Macro instruction file, which includes instructions that will be used by the apparatus at 50 to generate a GEOMETRY LOCATION DATABASE (referred to below as a "GLD"). Known systems will produce a GLD, without the relative location feature of the present invention. For instance, CAECO, Inc. of 270 Caspian Drive, Sunnyvale, Calif., markets a system known as CAECO LAYOUT TM which uses Macro instructions to generate a GLD. As has been mentioned above, a GLD is a data structure that provides instructions for a display apparatus 46, not part of the invention, which display apparatus can represent the group of objects according to any of a preselected range of formats, including representation on a computer monitor, on a paper copy or on a magnetic memory medium. Devices of this sort are known to those of ordinary skill in the art.

The Macro file, according to the illustrated embodiment of the invention, is a text file, which may be edited, as discussed below. It is known to create Macro files for recording representations of geometries in a coordinate system. For instance, CAECO, Inc., of 270 Caspian Drive, Sunnyvale, Calif. markets a system known as CAECO MACROS TM, suitable for the practice of the invention. According to the known devices, the Macro files record the locations of the geometries with reference to a fixed coordinate system.

Figures 2A, 2B, 2C, 2D:
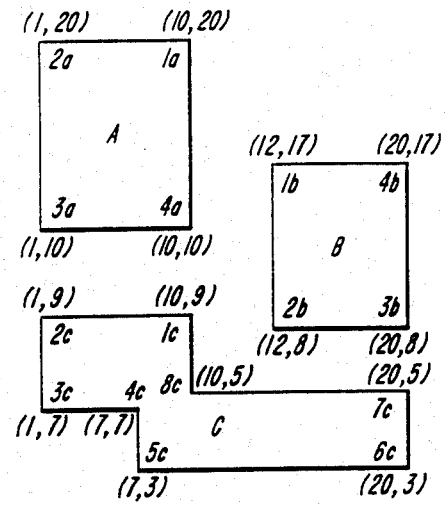
FIG. 2 comprised of FIGS. 2a–2d is a schematic representation showing a known method for recording the location of geometries, and the effect upon the stored GEOMETRY LOCATION DATABASE and displayed geometries caused by stretching a placed geometry.

The method by which known devices record locations of geometries will be more readily understood with reference to FIG. 2. FIG. 2a shows several geometries, identified as A, B, and C and in an x-y coordinate system having an origin at (0, 0). Geometries A and B are rectangular and geometry C is a zigzag polygon.

Known systems such as CAECO LAYOUT TM include apparatus for generating a Macro file of instructions which instructions locate all of the geometries in a group. The Macro file entries record each geometry's location using standard Cartesian coordinates. As shown in FIG. 2b, instructions for the location of geometry A are recorded in the Macro with coordinates relative to the origin (0,0). For instance, the vertex 1a of geometry A may have the coordinates (10, 20). Similarly, as shown in FIG. 2c, the location of geometry B is recorded in Cartesian coordinates relative to the fixed origin. The location of vertex 1b is, for example, at coordinates (12, 17).

These coordinates are stored by known devices in a Macro file, which, as mentioned above, is a series of instructions that can be executed by the apparatus at a later time. With respect to the two vertices 1a and 1b, the Macro file entries may be as simple as (10, 20) and (12, 17). There can also be a Macro file entry after the entry for the vertex 4a of geometry A, instructing the device to record geometry A as a polygon. The entry could be "PGON."

It is often necessary to enlarge, or move, previously placed geometries. For instance, the designer may realize that he needs a larger or smaller transistor, in place of one already placed. Thus, he must redefine the geometry in the Macro file and thus relocate the geometry in the GLD representation of the device itself, and also in the representation of that device either on the computer monitor display, or in any hard-copy that is generated. FIG. 2d shows schematically the effect on the display of editing the Macro file, according to the prior art by enlarging rectangular geometry A so that vertex 1a moves to coordinates (19, 20). Geometry A has collided with geometry B. Presumably, the designer did not intend this effect.

The apparatus of the invention, at 52 of FIG. 4, includes a device that generates Macro files in a way that permits recording the positions of the geometries relative to selected locater vertices or geometries. Upon relocation, resizing, etc. of the locater geometries, those geometries located relative thereto will also be relocated automatically by the apparatus of the invention.

FIG. 3 represents schematically the means by which the apparatus of the present invention accomplishes the automatic relocation. As in FIG. 2a, FIG. 3a shows three geometries A, B, and C, and a coordinate origin at (0,0). Similarly, FIG. 3b represents the means by which the location of the vertices of geometry A are stored in a Macro instruction file, with reference to the origin. Vertex 1a is at location (10, 20) and the Macro file reflects that absolute location.

It should be noted that practice of the invention is not limited to representations located using a Cartesian, or x-y or orthogonal coordinate system. The invention may be practiced with respect to representations using any coordinate system, including polar, trapezoidal, and others. If a non-Cartesian coordinate system is used, the exact methods for recording locations of gemetries and calculating relative locations should be adjusted accordingly, as will be evident to one of ordinary skill in the art. For purposes of simplifying the following description, a Cartesian x-y coordinate system will be discussed. The generality of the invention, however, is not so limited.

Figure 3A:
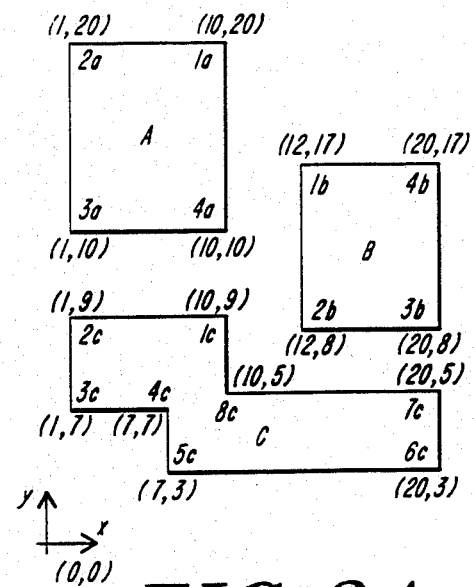
FIG. 3 comprised of FIGS. 3a–3d is a schematic representation showing the illustrated method of the invention for recording the location of geometries, and the effect upon the stored GEOMETRY LOCATION DATABASE and displayed geometries caused by stretching a placed geometry.
Figure 3B:
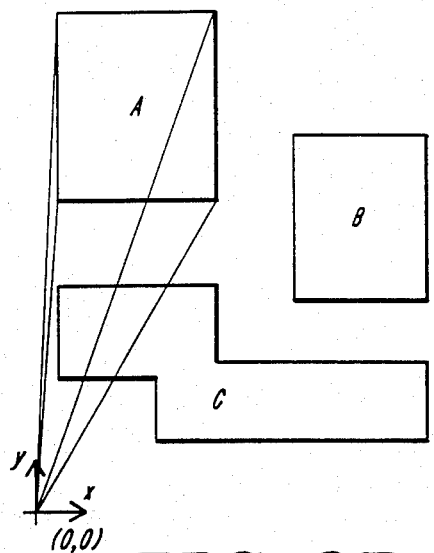
Figure 3C:
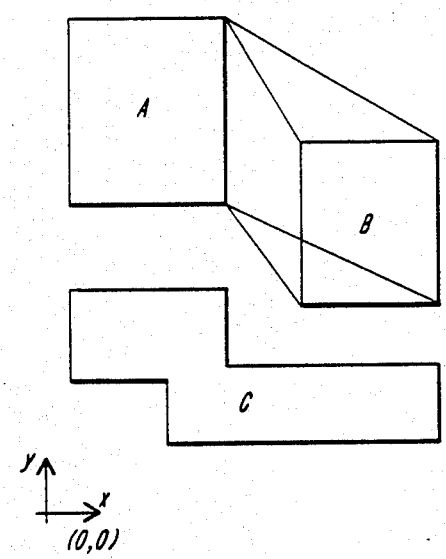

FIG. 3c shows schematically one substantial improvement of the present invention. When preparing the portion of the Macro file corresponding to the vertices of geometry B, rather than recording the location of vertex 1b as (12, 17), the apparatus of the present invention stores the location of vertex 1b relative to the location of vertex 1a or, for that matter, relative to any vertex previously recorded by the apparatus. Thus, the x coordinate of Vertex 1b is recorded as "the x coordinate of vertex 1a plus 2" (if it is originally located at (12, 17)) and the y coordinate of vertex 1b is recorded as "the y coordinate of vertex 1a minus 3). As an example of the Macro file entry for vertex 1b, the entry could be "RELPNT A 1a2−3. The string "RELPNT" in this entry instructs the device that it is to place in the GLD a vertex given by relative coordinates. The "A" and "1a" instruct the device to use vertex 1a of geometry A as the locater vertex. The "2" and "−3" instruct the device to place a new vertex at a point 2 from the x coordinate of vertex 1a, and −3 from the y coordinate of vertex 1a.

Figure 3D:
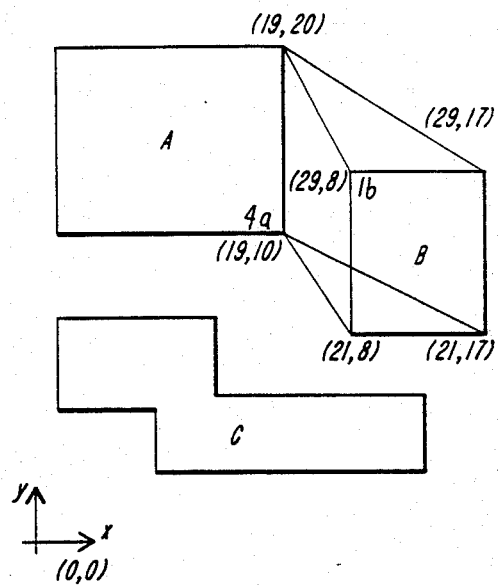

Thus, after the designer discovers a mistake or changes his mind, and enlarges geometry A, as shown in FIG. 3d, vertex 1a now is at (19, 20), just as it would be according to the known device. The recording in the Macro file of the instruction for the location of vertex 1b of geometry B, recall, was "the x coordinate of vertex 1a plus 2, and the y coordinate of vertex 1a minus 3." When the device later takes the Macro file, and uses it, at device 54, to generate a GLD, the geometries represented in the GLD, and if displayed on the computer monitor screen, do not collide. Rather, as seen in FIG. 3d, the geometry A expands, and the geometry B translates so that vertex 1b remains at the coordinates "the x coordinate of vertex 1a plus 2 the y coordinate of vertex 1a minus 3"; namely (21, 17).

As is evident from the foregoing discussion, the feature of the present invention is particularly advantageous when an early instruction in the Macro file is changed after creation of later instructions. The apparatus includes at least two means for changing the Macro file after initial creation. First, the invention provides editing apparatus at 56 for editing the text of the Macro file. Returning to the example of FIG. 3, a portion of the Macro file pertaining to vertex 1a of geometry A includes its coordinates, in the form (10, 20). Using the text editing device of the invention, the user can change the pertinent portion of the Macro file to (19, 20), as in the example shown in FIG. 3. Then, the user can instruct the controller 44 to create a GLD using the now edited Macro file. When the apparatus encounters an instruction in the Macro file generated with device 52 for recording positions of geometries as relative to other geometries, it will generate the appropriate data for the GLD, so that the relative geometry does not collide or conflict with the locater geometry.

The apparatus of the invention also includes circuitry 54 for interactively executing a Macro file. The circuitry 54 permits the designer to test a variable, where the location of vertices placed later depends upon the earlier chosen variables.

Thus, to summarize, the designer creates a Macro file, which will be used by the apparatus to create a GLD. The apparatus permits the designer to include instructions in the Macro file which permit locating a geometry relative to a previously placed geometry, rather than relative to a fixed coordinate origin. Thus, if the Macro file is changed at a later time, the apparatus can run the new Macro file instructions to create a new GLD, where the recorded actual locations of the relative geometries are automatically adjusted so that the relative geometries maintain the old spatial relation with the locater geometries. The apparatus at 58 then uses the GLD to generate any of a number of different representations of the group of geometries, either on a computer monitor, in computer memory, on a magnetic memory, or a hard-copy printout.

One configuration of an apparatus suitable for practicing the invention includes a Sun Series 2 or 3 Workstation, available from Sun Computer, based on the Motorola 68020 microprocessor having 8 megabytes of RAM and a 70 megabyte external memory storage device. The invention may also be implemented using the Apollo computer Domain Series, DN3000, DN580, DN570 or DN660. Other suitable configurations of hardware will be apparent to those of ordinary skill in the art.

As mentioned above, the method and apparatus can be implemented in either hardware, software, or a combination of both. In the illustrated embodiment discussed below, the method and apparatus of the invention have been implemented in a software configuration comparable to the hardware configuration of FIG. 4. The software is described in greater detail in connection with the flow charts of FIGS. 5–8.

Figure 5:
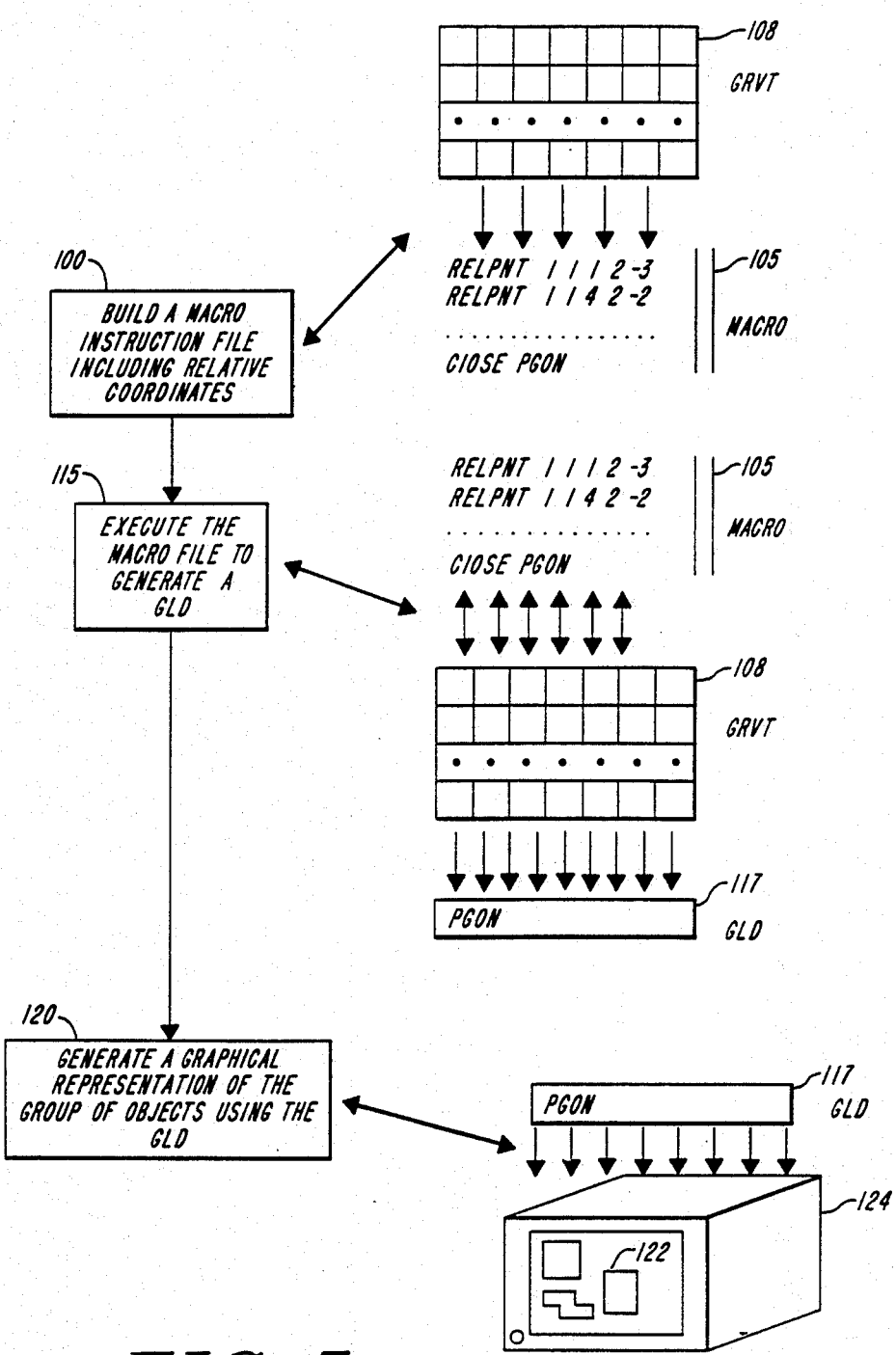
FIG. 5 is a general flow diagram of a preferred embodiment of the method of the invention, representing the general steps of building a Macro instruction file, executing the Macro instruction file, and generating a graphical representation of the group of objects.

Referring to FIG. 5, a general overview of the method and apparatus of the invention, the software, at 100, builds a Macro instruction file 105 including instructions to generate the locations of some of the geometries according to relative coordinates. The Macro file is built by receiving input from the user, as described in more detail in connection with FIG. 6, which inputs are used to create a GEOMETRY R-CELL VERTEX TABLE, referred to below as a "GRVT" 108. The software next, at 115, executes the Macro File 105 to generate a GLD 117, as described in more detail in connection with FIG. 8. Finally, the software, at 120, generates a graphical representation 122 of the group of objects using for instructions the GLD 117. The graphical representation may be on a computer monitor 124, a paper hard copy, a layout element in the process of creating a mask-work, etc.

Figure 6A:
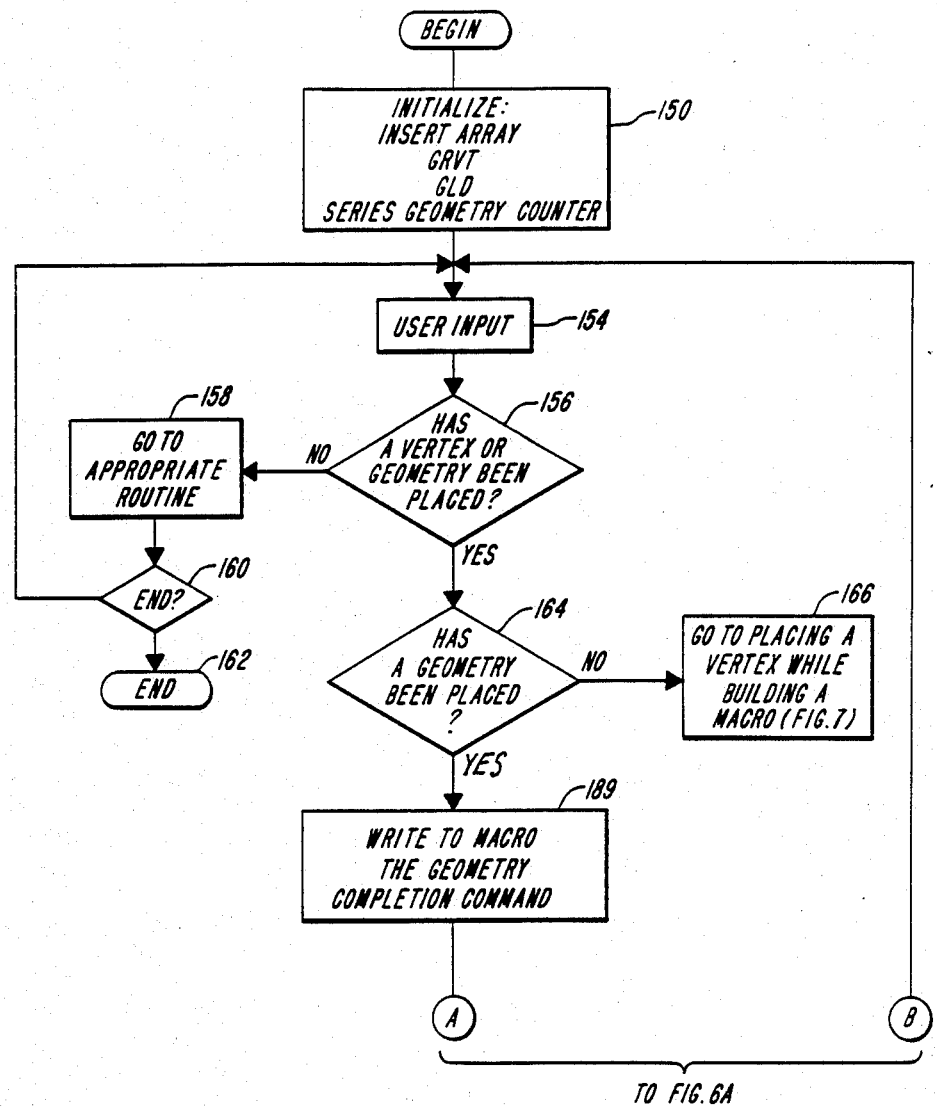
FIG. 6 comprised of FIGS. 6a–6c is a detailed flow diagram of a preferred embodiment of the method of the invention, representing the step of building a Macro file that provides instructions for creating a GEOMETRY R-CELL VERTEX TABLE and a GEOMETRY LOCATION DATABASE from which the locations and types of objects in the model can be determined.
Figure 6B:
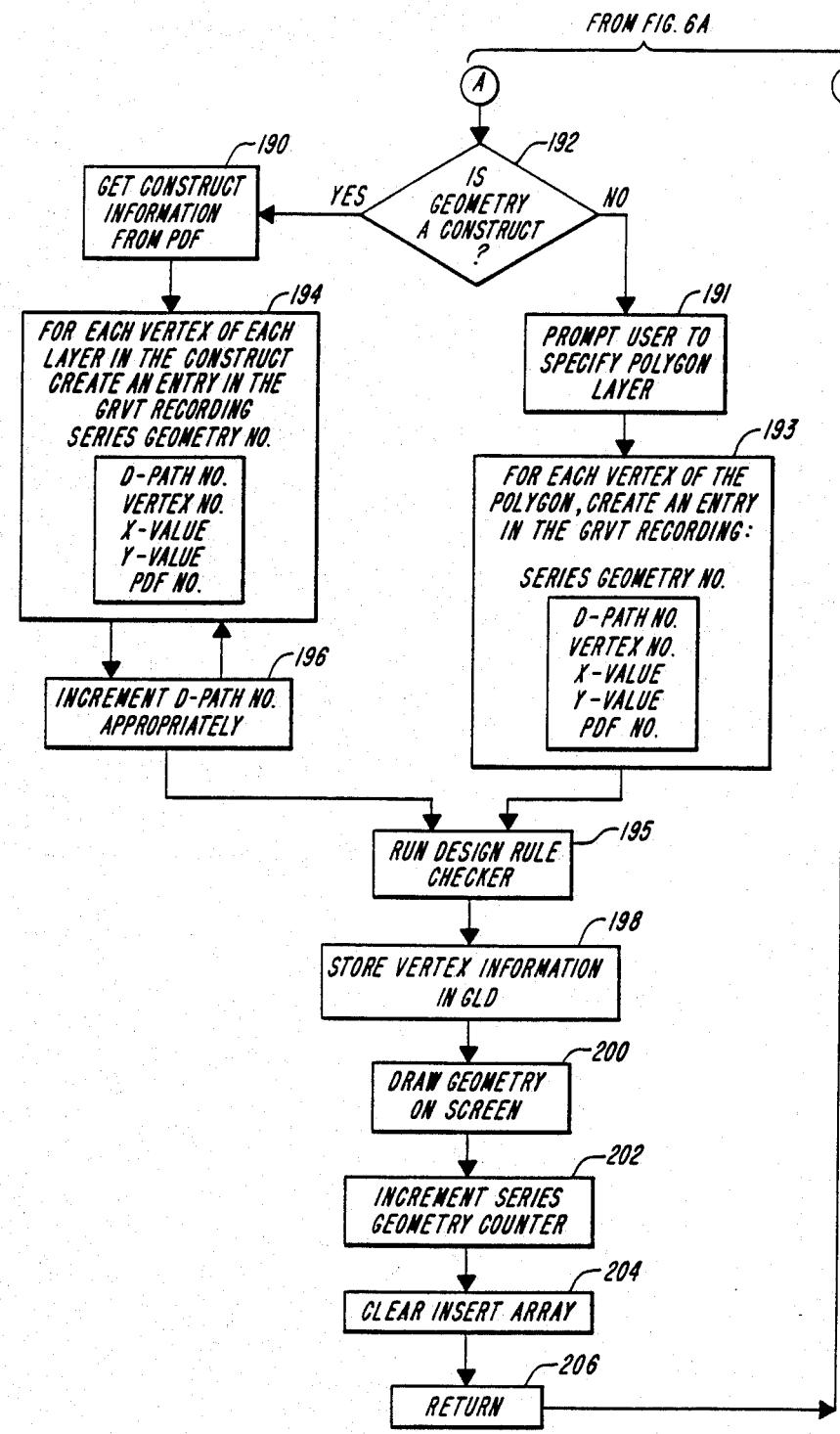
Figure 7A:
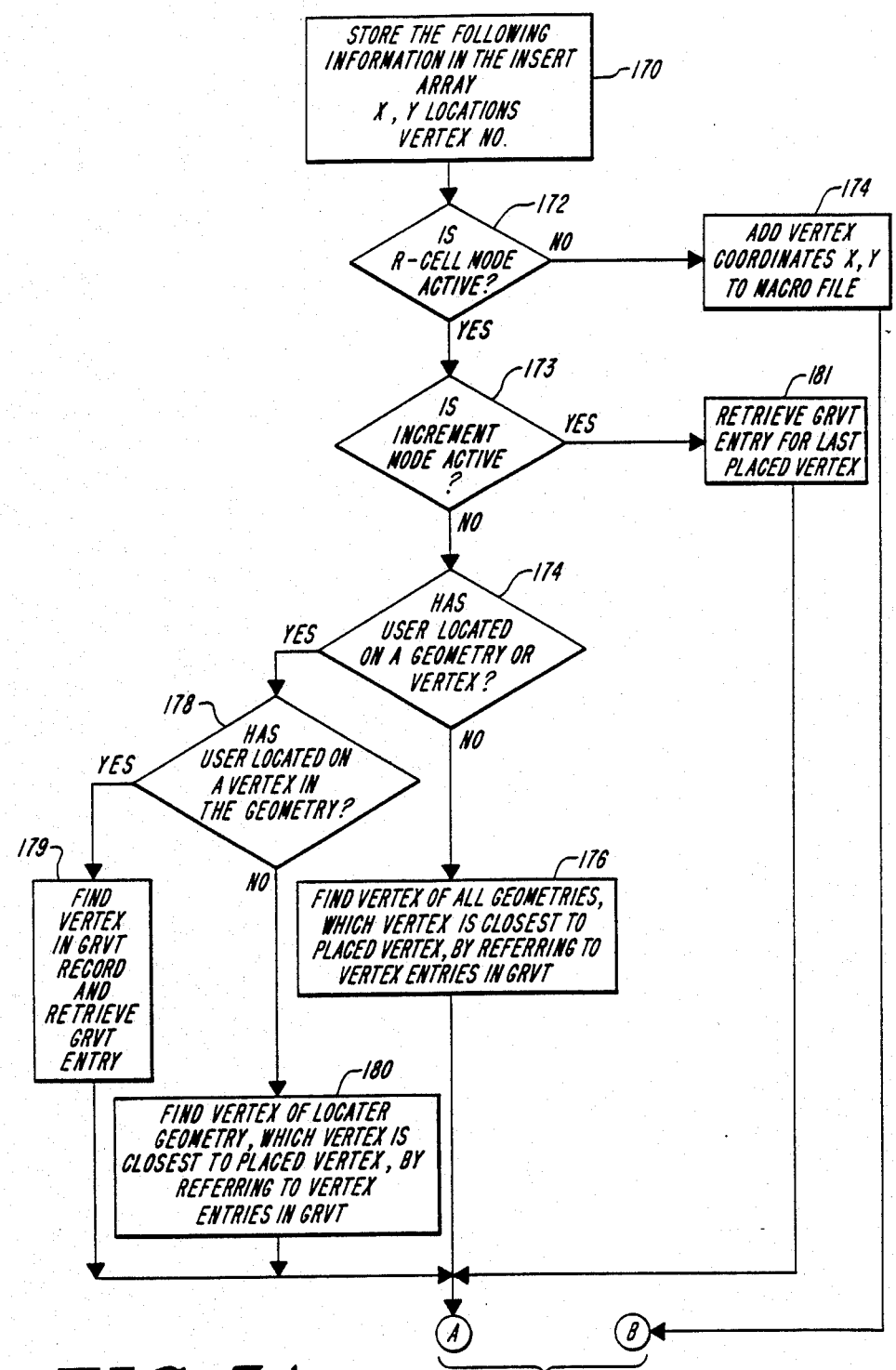
FIG. 7 comprised of FIGS. 7a–7b is a detailed flow diagram of a preferred embodiment of the method of the invention, representing the step of recording placement of a vertex in a relative locater mode, while building a Macro file, such as would be built according to the flow diagram of FIG. 6.
Figure 7B:
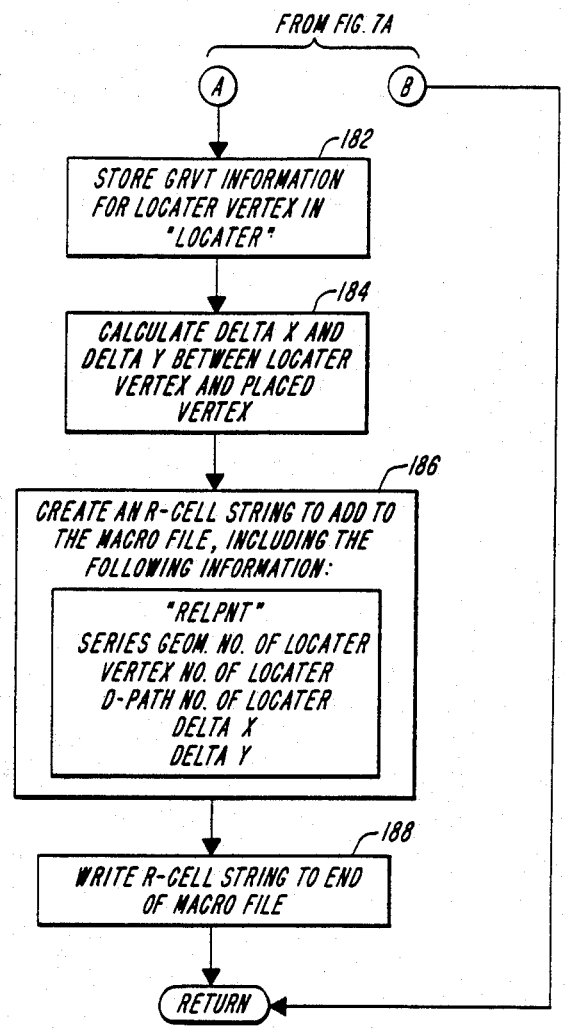

Turning now to FIGS. 6 and 7, the software that builds a Macro file will be described in detail. As seen in FIG. 6, at 150, the software first initializes several data structures discussed below, including the Insert Array, the GRVT, the GLD and a Series Geometry Counter. Next, at 154, the user provides an input. The user may provided one of a variety of input commands, including placing a vertex; identifying a group of vertices to be combined into a predefined construct, such as a transistor, gate, or contact; identifying a group of vertices to be combined into a polygon; selecting a geometry or vertex as a locater geometry or vertex; identifying a group of vertices to be compared and chosen as locater vertices according to preselected parameters; and signifying the completion of a Macro file.

The particular embodiment of the software described below is interactive with the user. Thus, the program prompts the user for instructions, and the user gives instructions regarding building the Macro file. As the software processes the user's instructions, the software also instructs the processor to display over a color monitoring system the positions of the placed vertices and geometries. The processor uses the same software display routine to display the geometries and vertices during building of a Macro file, as it would use to build the monitor display of the completed group of objects.

Upon recognizing an input from the user, the software checks at 156 whether either a vertex or a geometry has been "placed". If the input is not a vertex or geometry placement, the software executes the appropriate routine at 158. Handling of the user inputs other than placement of a vertex or a geometry may be completed by software and apparatus known to the routineer. Upon execution of the appropriate routine(s), the software tests at 160 to determine if the input was an "end" command. If it was, the software terminates execution at 162. If not, the software returns to accept another user input at 154.

Following now the path where the test at 156 confirms that either a vertex or geometry has been placed, the software checks at 164 whether a geometry has been placed. If a geometry has not been placed, this means that a vertex has been placed and the software executes the routines at 166, to be discussed immediately below, appropriate for a vertex having been placed. If a geometry has been placed, the software executes the commands at 190, to be discussed further on below.

The software executed at 166 while placing a vertex is illustrated more fully in the flow chart of FIG. 7. At 170, the software stores certain information about the vertex in the Insert Array. The Insert Array is a data structure that is cleared after the software executes a geometry completion command, discussed below. For each vertex in a geometry, an entry in the Insert Array identifies the cartesian coordinate of the vertex relative to an origin. A representation of the origin is displayed on the computer monitor screen, and the Cartesian coordinates stored in the Insert Array correspond to the coordinates shown on the screen for the particular vertex. The coordinates stored in the Insert Array are absolute, such as (10,20).

Also stored in the Insert Array, is the vertex number. The vertex number is a number for differentiating the vertices of a geometry The vertex number is reset to 0 each time that the Insert Array is reset and incremented by 1 as each new vertex is placed. The purpose of the vertex number will be understood from the discussion below.

After adding the information regarding the vertex to the Insert Array, the software at 172 checks whether the user has activated the relative geometry location mode, known as the "R-Cell" mode. If the user has not activated R-Cell mode, the software at 174 adds the absolute vertex coordinates, such as "10 20," to the Macro file. Depending on the software, the coordinates may be deliminated by a space, a semi-colon, or any other appropriate symbol. After adding the absolute entry to the Macro file, the software at 177 returns to block 154, the user input, of FIG. 6, the flow diagram for building a Macro File.

If the user has activated R-Cell mode, the software tests at 173 of FIG. 7 whether the user has also activated Increment Mode, which is discussed below. Briefly, in increment mode, vertices are located relative to the vertex most recently placed, rather than relative to vertices meeting other conditions, as discussed immediately below.

If the user has not chosen Increment Mode, the software tests for which of three options the user has chosen to facilitate locating a vertex relative to a locater vertex. The software permits the vertex to be relative to: the closest vertex of all geometries; the closest vertex of a specified geometry; or a specified vertex. The software may test for the selected condition in any order.

In the illustrated embodiment, the software first checks at 174 whether the user has designated a locater vertex or geometry. If not, the processor continues to 176 and, as described below, finds the vertex in all of the located geometries that is closest to the vertex being placed. The software tests at 178 whether the user has selected a vertex within the locater geometry. If not, the software at 180, finds the vertex in the geometry closest to the relative vertex. If the user had specified a locater vertex, the processor at 178 branches to 182, and stores information pertaining to the vertex, in the record variable "LOCATER".

In order to understand the method by which the software at 176 determines which locater vertex or, at 180, which vertex in the locater geometry, is closest to the relative vertex, it is necessary to discuss the GRVT or Geometry R-Cell Vertex Table, a portion of which is illustrated schematically at FIG. 9a. FIG. 9a is a portion of the GRVT that would be generated by the software in connection with building a Macro file for locating the geometries shown in FIG. 2a.

The software generates the GRVT as the user places vertices. In the example shown in FIG. 9a, the user first placed vertex 1a of geometry A. This is shown at Table Index 1. The GRVT does not actually include a field corresponding to the Table Index. The Table Index has been added for discussion purposes only. The entries in the GRVT for Table Index 1 are as follows: Series Geometry No. =1; D-path No. =1; Vertex No. =1; x value =10; y value =20; flag =3; and PDF No. =1. The Series Geometry No. equal to 1 signifies that geometry A is the first geometry placed in this Macro file. The Vertex No. equal to 1 signifies that vertex 1a is the first vertex of the first geometry placed by the user in this Macro file. The absolute x value of 10 signifies that the x location of 1a is at 10 units, and the absolute y value of 20 has a like significance with respect to the y location. The D-Path no., flag and the PDF no. are not pertinent to this portion of the invention, and will be discussed below.

The entries for Table Index 2 are as follows: Series Geometry No. =1; D-Path No. =1; Vertex No. =2; x value =1, and y value =20; flag =3; and PDF No. =1. The Series Geometry No. equal to 1 signifies that the vertex is also in the first geometry placed in this Macro file. The Vertex No. equal to 2 signifies that vertex 2 is the second vertex placed by the user in the first geometry placed in this Macro file. The absolute x value of 1 signifies that the x location of 2a is at 1 unit, and the absolute y value of 20 has a like significance with respect to the y location. The entries for Table index 3 and 4 correspond similarly to the pertinent information regarding vertices 3a and 4a of geometry A.

The entries for Table indices 5–12 all pertain to the vertices of the zig-zag geometry C. The first vertex placed by the user was vertex 1 at coordinates 10, 9. The entries for Table indices 13–16 pertain to the vertices of geometry B.

The software generates the GRVT as the user gives commands for the placement of vertices and the completion of geometries. After placement of each point, the Vertex Number in the Insert Array was incremented by 1. After completion of a geometry, the Insert Array, including the Vertex Number counter, was reset, and the Series Geometry Number counter was incremented.

In connection with a discussion of the software at 176, 178 and 180, reference is made to the vertex 1b at coordinates (12, 17) of FIG. 3e. Three related examples, 1A, 1B and 1C will be discussed below all related to selecting a locater vertex. In the first example, Example 1A, the user has activated the R-Cell mode. For Example 1A, assume the user wants to identify vertex 1a of geometry A at coordinates (10, 20) as the locater vertex. To do so, the user specifies that he is about to identify a locater vertex, by either by typing in a command, such as "LOCVERT" from the keyboard, or by some other known means. The software at 174 answers "yes" to the decision inquiry and proceeds to 178, where it again answers "yes." The software at 179 then runs through the GRVT, searching for the entry having the appropriate x and y values and Series Geometry No. For vertex 1a, that entry is found at Table Index 1. The software at 182 makes a copy of the entries of the GRVT for vertex 1a and places that copy in record variable "LOCATER." The software completes the same steps for all variants of this Example 1 (1A, 1B and 1C), namely when the user selects a locater vertex, when the user selects a locater geometry or when the user does not select a locater element and leaves the software to select the default locater of the closest vertex to the vertex.

Returning to the portion of the software at 178 which determines whether the user, having selected a locater geometry, has also selected a locater vertex, if the user has not selected a locater vertex, the software proceeds to 180. In the second example, Example 1B, the user wants, for example, to select geometry A as the locater geometry, but not to select any particular vertex in geometry A. Similar to selecting a locater vertex, the user enters a command, such as "LOCGEOM", and then moves the cursor to the desired geometry. At 180, the software tests the entries in the GRVT to find the vertex in the geometry A, (Series Geometry 1), that is closest to the placed vertex, for example vertex 1b. According to known techniques of display control, the software determines the Series Geometry no. of the selected locater geometry A.

The software searches through the GRVT to find the first entry signifying a vertex contained in geometry A. The first vertex in geometry A the software encounters is vertex 1a at coordinates (10, 20). (In this example, the search is rather trivial, since the desired vertex is the first encountered.) The software uses known Cartesian comparison techniques to determine the absolute distance between vertices 1a and 1b. The software stores the value for this absolute distance in a variable, and proceeds to the next vertex of geometry A, at coordinates (1, 20), for which it conducts an identical comparison to arrive at an intervening distance.

Next, the software compares the distance from vertex 1b to vertex 2a with the distance from vertex 1b to vertex 1a. In this case, the distance to vertex 2a is greater than the distance to vertex 1a, so the software maintains its record of vertex 1a as the closest so far in geometry A to vertex 1b.

The software proceeds through the GRVT, testing each of the vertices of geometry A. In this example, the software will never encounter a vertex closer to vertex 1b than is vertex 1a. If it had, the software would disgard its record of vertex 1a as being the closest and replace that record with a record of the closer vertex. After the software has checked through all of the entries in the GRVT, it will have in memory the record of the vertex in geometry A closest to vertex 1b. That vertex will be vertex 1a. Just as was the case in Example 1A, the software at 182 makes a copy of the entries of the GRVT for vertex 1a of geometry A and places that copy in record variable "LOCATER." Example 1C, the user has not selected either a geometry or a vertex from which to locate the relative vertex 1b. In this case, the software searches through the entire GRVT, to determine the vertex closest to the relative vertex. It does not matter in which geometry the locater vertex rests. The software conducts the same type of comparison tests and vertex recording as it did in Example 1B. Upon selection of the closest vertex, the software at 182 makes a copy of the entries of GRVT, for example, for vertex 1a of geometry A and places that copy in record variable "LOCATER".

For purposes of simplifying the following discussion, the foregoing Examples 1A, 1B, and 1C have been chosen so that the locater vertex was in each case vertex 1a. This need not be, and in fact would not usually be the case. The user could have specified geometry C as the locater geometry, or vertex 3a or any other as the locater vertex.

To summarize, at this point in Examples 1A, 1B and 1C, the software has in memory with respect to vertex 1b all of the entries for the GRVT, namely the series geometry no. in which it is found, which vertex of that geometry, and the absolute x and y values. The software has in the variable LOCATER the same information for the locater vertex 1a. At 184, the software calculates and records the relative x and y distances (delta x and delta y, respectively) between the vertex recorded in LOCATER and the point 1b recorded in the GRVT. In this case, delta $x=2$ and delta $y=(-3)$.

At 186, the software creates a string of ASCII characters, referred to below as an "R-Cell" string, which string includes the following entries, deliminated by spaces "RELPNT"; Series geometry no. of LOCATER; Vertex No. of LOCATER; delta x; and delta y. For example, for the Examples 1A, B and C discussed above, the R-Cell string would be:

RELPNT 1 1 1 2 −3

Having created the R-Cell string, the software at 188 writes the R-Cell string to the end of the Macro instruction file. Finally, in these three examples (Examples 1A, 1B and 1C) of placing a vertex while building a Macro instruction file, at 177 the software returns to accept user input at 154 as shown in FIG. 6.

Returning now to FIG. 7, another Example, Example 2 of placing a vertex while building a macro file will be discussed. In Example 2, the user has activated the invention's Increment Mode, which the software determines at 173. In Increment Mode, rather than locating a vertex relative to a chosen vertex, or the closest vertex among those already placed, the software designates the most recently placed vertex as the locater vertex for the new relative vertex. The information pertaining to the locater vertex is already recorded in the previous entry of the GRVT, and is retrieved by the software at 181. The software copies the pertinent data into the record LOCATER at 182, as was the case in Example 1 and proceeds to block 184.

As an illustration of the Increment Mode, reference can be made to FIG. 2a. The user has placed vertex 1b at coordinate (12, 17) and has activated the Increment Mode. Upon placement of vertex 2b at coordinate (12, 8), the software will store in the Insert Array the absolute x value $=12$; and the absolute y value $=8$. At 181, the software retrieves from the Insert Array the information for the last placed vertex, $x=12$ and $y=17$. At 182, the software will store these into LOCATER. After the software at 184 calculates the delta x and delta y values, it will create an R-Cell string to add to the macro file as follows:

RELINC 0 −9

Returning now to FIG. 6, the process of building a Macro file will be further discussed with reference to the placing of geometries. As has been mentioned above, at 164 the software tests whether a geometry has been placed. If a geometry has been placed, the apparatus at 189 adds an entry to the Macro file signifying the type of geometry. As an example, if the geometry is polygon, the entry may be "PGON"

The apparatus must obtain certain information about the geometry, which it does at 190. This information will be used in completing entries in the GRVT for the vertices of the geometry. The type of information that will be germane to different geometries depends upon the application for which the designer uses the invention. The field of designing VLSI circuits is representative. In this field, the geometries represent at least two classes of objects: polygons and constructs. Polygons are rectangles, triangles, hexagons, etc. In the actual object of the VLSI circuit, polygons exist on only one layer. Constructs, however, usually have elements on different layers, as discussed briefly above in connection with FIG. 1. It is possible to define each construct according to formulae based upon specifying only one layer. The specified layer is known in the art as the "primary path". The other layers of the construct are known as "D-paths", for "dependent paths," since the orientation of the D-paths depend upon the primary path.

For instance, with respect to the MOS transistor of FIG. 1, it would be possible to specify that geometry 12, an $n_+$ path would have dimensions of 4 microns by 9 microns. From this it could be determined that the geometry 14, a polysilicon path is on an adjacent layer of the VLSI circuit, having a center line the same as that of the geometry 12, except that the polysilicon path begins 5 microns after the beginning of the center line, and the polysilicon path is 9 microns wider than the $n^+$ path. Similarly, the geometry 16 can be defined in terms of the geometry 12.

Thus, the geometry 12 is the primary path, and the information for defining the geometries 14 and 16 can be stored in a file under an identifier for a simple MOS load transistor. The user specifies the vertices corresponding to the object on the primary path, and then provides the input that the geometry has been completed, and that it is a MOS load transistor. There is stored in computer memory, a data file referred to below as a Process Definition File ("PFD"), having information relating the design of constructs to a construct index, referred to below as a PDF no.

At 192, the software determines if the geometry is a construct, or a simple polygon, the only other possibility allowed in R-Cell Mode. If the geometry is a construct, the software branches to 194. Having retrieved at 190 from the PDF the pertinent information for the construct represented by the geometry, the software can now supply the information to fill in the GRVT, namely the D-path number, and the PDF number referred to but not discussed above. As will be recalled, and more easily understood with reference to FIG. 9a, upon placement of a vertex, the software creates an entry in the GRVT including the Series Geometry No., the Vertex No. and the absolute x and y values. Now, having read the input from the user as to the type of construct, and having retrieved the construct information from the PDF, the software can return to the GRVT at 194 and for each of the vertices of the D-path, identify which layer in the construct the D-path occupies, and the PDF no. for the Geometry type.

If the construct is a multi-layer one, the software at 194 calculates the locations of the vertices of the geometries on every D-path and creates entries in the GRVT corresponding to the D-path geometries. For the primary path, the software assigns the D-path no. equal to 1. For each subsequent D-path geometry, the software at 196 increments the D-Path no.

Returning to decision block 192, if the geometry is not a construct, the software branches to 193. If the geometry is not a construct, it is a polygon existing on only one layer. At 191, the software prompts the user to provide an input specifying the layer of the semiconductor device on which he wants the polygon to exist. At 193, the software creates an entry in the GRVT. The entry includes the absolute x and y values, and the vertex No., all of which have been accumulating in the Insert Array. The entry also includes the Series Geometry No., which is the current value of the Series Geometry counter. The entry also includes a D-path No., which for a polygon is a default (1 in the example shown in FIGS. 9a and 9b) and the layer No. retrieved at block 191.

Turning now to FIG. 9, it will be seen that the GRVT also includes an entry designated only as "flag." The purpose of the flag entry is to specify whether the geometry is a construct or a polygon. If the geometry is a construct, the flag is set at 1, if a polygon, it is set at 3. The flag facilitates interpreting the PDF no. for purposes of creating the graphic output, such as on a computer monitor. This is because the PDF numbers begin at 1 and increase to a larger number, such as 200. Recall that for a polygon, the PDF no. is the layer of the semiconductor device upon which the polygon rests, which layer will typically be between 1 and 64. Thus, to signal the processor that for a polygon, the entry in the PDF no. field means something different than it does for a construct, the flag is used.

If the designer is building a VLSI circuit, it is advantageous to include a Design Rule Checker 195 in the software. As has been mentioned above, in the design of VLSI circuits, it is necessary to maintain a minimum clearances between elements. Design Rule Checkers have been designed which can review the placement of elements recorded in a data base such as the GRVT, and check to see that the minimum clearances have been maintained before permitting the user to continue. An interactive Design Rule Checker is described in an article by the inventor in February 1985 issue of "VLSI Design" Magazine, at pp 34–39, entitled "An Interactive Design-Rule Checker." The article is incorporated herein by reference. A suitable Design Rule Checker to practice the invention is available from CAECO, Inc. of Sunnyvale, Calif. in the software package known as CAECO CHECKER ™.

At 198, the software stores in the GLD, the Geometry Location Database, the same information as is contained in the GRVT, but in a more compact form. Software which will convert data in the form of the GRVT to the form of the GLD is included in the software package CAECO LAYOUT ™, referred to above. The form of the GRVT is designed for searching throughout, to facilitate comparison of vertex locations and the other operations discussed above. The form of the GLD is designed to maximize speed in creating graphic output.

At 200, the controller directs implementation of a display software routine, which takes the GLD, and uses the information contained to draw the entire construct on the monitor screen. Thus, as the user builds a Macro file that is designed to build a GLD for later use, the software builds a GLD to use to present a graphical representation of the objects being designed on the designer's computer monitor screen.

Upon completion of the drawing, the controller increments the Series Geometry No. counter at 202, clears the Insert Array at 204, to make ready for the placement of a vertex in another geometry, and at 206 steps to 154 to accept the user's next input. eventually, the user will place the final object, and direct the software to end the Macro building operation at 162.

Figure 8A:
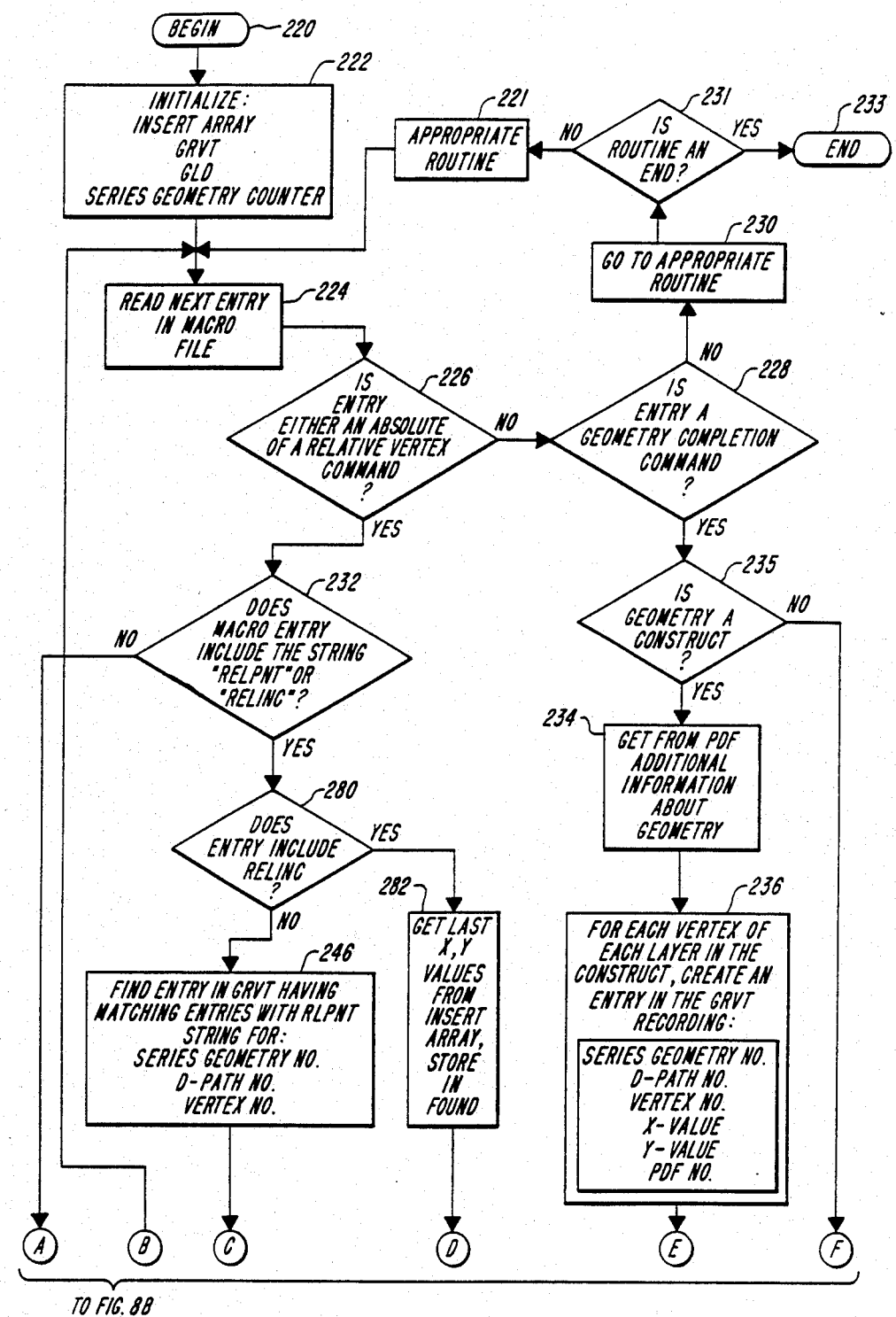
FIG. 8 comprised of FIGS. 8a–8b is a detailed flow diagram of a preferred embodiment the method of the invention, representing the step of executing a Macro file, such as would be built according to the flow diagram of FIG. 6, to create a GEOMETRY LOCATION DATABASE from which the locations of types of objects can be determined.
Figure 8B:
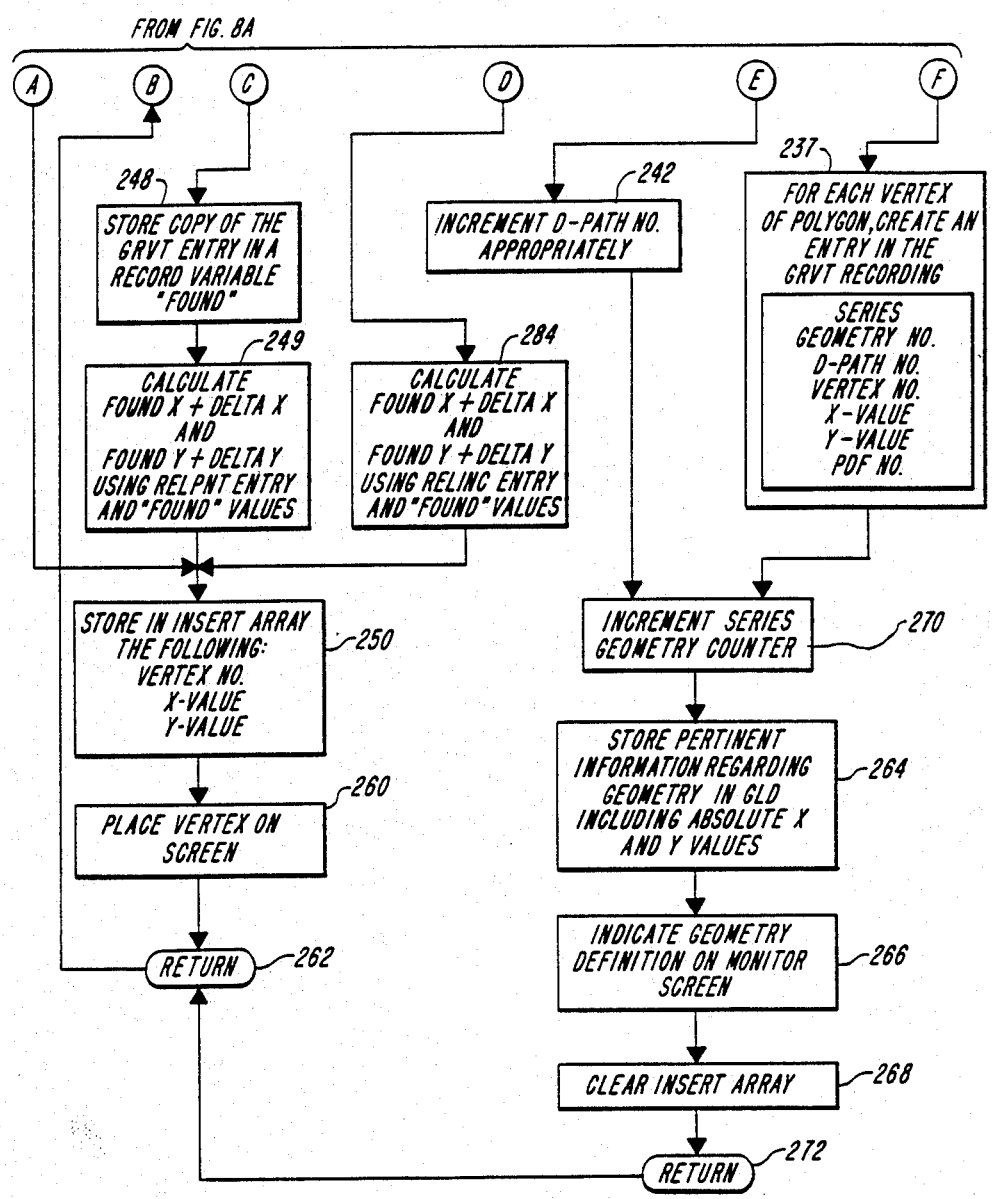

Having created a Macro instruction file, the user next executes the Macro instruction file to create a permanent GLD, which will be used to generate the graphical, etc. representation of the group of objects. FIG. 8 is a detailed flow diagram of the software to execute a Macro instruction file and build a GLD. Many of the portions of software are similar to those used to build a Macro instruction file, because, while building a Macro instruction file, the software also creates a GLD.

Execution of the software begins at 220. At 222, the software initializes the Insert Array, Series Geometry counter, GRVT and GLD, just as at 150 above. At 224 the software reads the first (or next) entry in the Macro file. At 226, the software tests to determine if the entry is a vertex placement (absolute or relative), in which case the software branches to 232, or not, in which case the software branches to decision point 228. At 228, the software tests to determine if the entry is a geometry completion command, in which case it branches to 234, or not, in which case the software branches to 230, which directs the software to run the appropriate routine. At 231 the software tests whether the appropriate routine is an end routine, in which case the controller ends processing at 233. If not, the controller executes the appropriate command at 221 and eventually returns control to the software to read the next entry in the Macro file at 224, where execution continues to loop.

Returning now to decision point 232, the software follows the branch for dealing with placement of either an absolute or relative vertex. If the entry does not include the string "RELPNT" (or "RELINC" if the embodiment includes this version of Increment Mode) and thus specifies a absolute point, the software branches to 250 and places an entry in the Insert Array for a vertex having the current Vertex no. and the absolute x and y values in the Macro entry. After recording the Insert Array entry, the software at 260 places the vertex on the monitor display and then returns at 262 to 224 to read and execute the next entry in the Macro file.

Returning now to decision point 232, if the Macro entry includes the string "RELPNT" or "RELINC", the software executes the routines associated with the feature of the invention permitting the relative location of vertices and geometries. Recall that the RELPNT entry will be of the following form: "RELPNT 2 1 7 4 0" and the RELINC entry will be of the following form: "RELINC" 4 0. At 280, the software tests to determine if the entry is a RELPNT or a RELINC entry. If it is a RELPNT entry, the software branches to 246. At 246, the software searches through the entries in the section of the GRVT created so far during this execution of the Macro file for an entry matching the Series geometry no., D-path No. and Vertex No. of the RELPNT Macro entry. In connection with the RELPNT example above, these entries are "2", "1" and "7", respectively. Referring to FIG. 9a, a representation of the GRVT for the example shown in FIG. 2a. Table index 11 matches the entries. Thus, the vertex at Table entry 11 is the locater vertex.

At 248, the software stores the x and y values from the locater vertex in a variable record called "found".

At 249, the software calculates the location of the relative vertex by adding the delta x and delta y values from the RELPNT entry to the found x and found y values respectively. Thus, in the example above, the relative x and y values are 24 (20+4) and 5 (5+0), respectively. At 250, the software stores the location of the relative vertex in the Insert Array, exactly as it did with respect to the absolutely located points discussed above.

Returning now to the decision block 280, if the entry includes RELINC, the software branches to block 282, where it retrieves the x and y values most recently entered in the Insert Array, from reading the previous Macro instruction. The software also at this point stores these vales in the record variable "found". At 284, the software calculates the found x+ delta x and found y+ delta y values using the RELINC entries and the x and y values in found, similar to the calculation done at block 249. Upon calculation of the new locations, the software stores these in the Insert Array at 250.

The software keeps branching from the vertex entry test at 226 to the RELPNT entry test at 232, until the macro file includes an object completion command, in which case the software branches to 228 and through 234. As was discussed above, in connection with building a macro file, and FIG. 6, the object completion command includes a command that the object is complete, and also identifies the type of object by a PDF no. if the object is a construct. As mentioned above, if the object is a polygon, there will be an instruction in the Macro file, entered by the user in response to a prompt, specifying the layer upon which the polygon rests.

At 235, the software tests whether the geometry completed is a construct or a polygon. If the geometry is a polygon, the software branches to block 237. If it is a construct, the software branches to 234, and gets the appropriate information from the Process Definition File, using the PDF no. The software proceeds to 236, where the processor stores in the GRVT, the following information for each vertex of the construct: the Series Geometry no., which is the value of the Series Geometry counter, the D-path no., which is obtained from the Process Definition File; the vertex no., which has been stored in the Insert Array, along with the respective absolute x and y values; and the PDF no. If the PDF indicates that the geometry is a multi-layer construct, a routine is called at 236 which calculates the vertices for geometries in all D-paths of the construct, and adds that information to the GRVT, incrementing the D-Path no. at 242 if necessary.

If the geometry is not a construct, the software branches to 237. If the geometry is not a construct, then it is a polygon. At 237, the software creates an entry in the GRVT with respect to the polygon. The entry includes the absolute x and y values, and the vertex No., all of which have been accumulating in the Insert Array. The entry also includes the Series Geometry no., which is includes a D-path no., which for a polygon is a default (1 in the example shown in FIG. 9a and 9b) and the entry in the PDF no. field, retrieved at block 228 as part of the geometry completion command. At 270, the software increments the Series Geometry Counter.

At 264, the software stores the pertinent information regarding all of the geometries in the GLD in the compact form, including all x and y values as absolutes. At 266, the controller creates a representation on the computer monitor of the geometry. Finally, the software clears the Insert Array at 268 and returns to 224 to read the next entry in the Macro file. The software continues to loop through the geometry recording and placement steps, until an end command is finally reached and executed at 233.

The benefit of creating instructions for the Macro file, in R-Cell mode may be readily seen with reference to FIG. 2 and FIG. 9a, and FIG. 3 and FIG. 9b. It will be recalled that FIG. 2 is created by recording the Macro instructions in absolute mode rather than R-cell mode. Referring to FIG. 2, the Macro instructions for generating geometry B in absolute mode would be:

12, 17; 12, 8; 20, 8; 20, 17; PGON.

Upon execution of these Macro instructions, the software makes entries in the GRVT such as are shown in Table Index entries 13–16 of FIG. 9a. The software also makes similar entries in the GLD, although in a more compact form. It should be noted that neither the Macro entries, the GRVT entries, nor the GLD entries depend at all on the entries for geometry A, which are found in the GRVT at Table Indices 1–4.

After generation of the macro file, the user may wish to change the size of geometry A, as shown in FIG. 2d. The designer may easily change the size of geometry A by changing the Macro instructions corresponding to the two right most vertices (table indices 1 and 4 respectively) from (10, 20) to (19, 20) and (10, 10) to (19, 10), respectively. Unfortunately, the Macro file instructions for geometry B remain

"12 17; 12 8; 20 8; 20 17; PGON", and the software will create the same GRVT entries for geometry B as it did the first time through, shown in Table Indices 13–16. If the software converts these GRVT entries into a GLD file and then instructs the controller to display the recorded geometries, the result will be as seen in FIG. 2d; geometry A will overlap geometry B.

If, however, before first defining the Macro instructions for geometry B, the user had activated R-Cell mode, and had designated vertex 1a as the locater vertex for relative vertices 1b and 4b, and vertex 4a as the locater vertex for relative vertices 2b and 3b, as shown schematically in FIG. 3, the location of geometry B would automatically be adjusted as shown in FIG. 3d. In that case, the Macro file instructions for placing the vertices of geometry B would be:

RELPNT 1 1 1 2 −3

RELPNT 1 1 4 2 −2

RELPNT 1 1 4 10 −2

RELPNT 1 1 1 10 −3

CLOSE PGON.

Thus, upon execution of the Macro file the first time, with the coordinates of geometry A unchanged, when the processor reads the first instruction pertaining to geometry B, "RELPNT 1 1 1 2 −3", the software directs the processor to find the entry in the GRVT having the Series Geometry no., D-Path no. and Vertex no. as 1 1 1, respectively, record the x and y values of 10 and 20 respectively, and to make an entry in the GRVT for the first vertex of geometry B having an x value of 10+2=12 and a y value of 20−3=17. FIG. 9a shows the entries of 12 and 17 in the x value x and y value fields respectively of Table Index 13. Similarly, the x and y values for vertex 3 of geometry B, which will be entered at Table index 15, calculated using the Macro file instruction "RELPNT 1 1 4 10 −2" will be 10+10=20, 10−2=8.

Turning now to the case shown in FIG. 3d, where the vertices 1a and 4a have been shifted 10 units to the right, and the entries in the GRVT are as shown in FIG. 9b, the calculation of the location of the vertices of geometry B will be conducted exactly as immediately above. The only difference will be that the x and y values of the respective locater vertices 1a and 4a, stored at GRVT Table Indices 1 and 4 respectively, will be different, providing different locations for all of the vertices of geometry B.

Thus, upon execution of the Macro file after the user has changed the location of geometry A, when the processor reads the first instruction pertaining to geometry B, "RELPNT 1 1 1 2 −3", the software directs the processor to find the entry in the GRVT having the Series Geometry no., D-Path no. and Vertex no. as 1 1 1, respectively, record the x and y values of 19 and 20 respectively, and to make an entry in the GRVT for the first vertex of geometry B having an x value of 19+2=21 and a y value of 20−3=17. FIG. 9b shows the entries of 21 and 17 in the x value and y value fields respectively of Table Index 13. Similarly, the x and y values for vertex 3 of geometry B, which will be entered at Table index 15, calculated using the Macro file instruction "RELPNT 1 1 4 10 −2" will be 19+10=29, 10−2=8.

As has been mentioned above in connection with FIG. 4, the invention may be practiced by executing the Macro instruction file in either an automatic or interactive mode. The automatic mode has been described above. To activate the interactive mode, the user adds a special command to the Macro file at the point he wants to provide user input. For instance, the user terminates a construct definition with the command, such as "WIDE ? '12'" rather than the normal "WIDE '12'". The normal instruction will be carried out by the processor to use the previously placed points as the basis for defining a Wide transistor, having a base measurement of 12.

The processor executes the interactive command by prompting the user to decide whether he wishes to change the base measurement of 12. If the user does, he enters the new base measurement, say 15, and the processor uses 15 to calculate the locations of the vertices within the wide transistor governed by the base measurement. These vertices may all be on one D-path, or they may be on several D-paths. The record of the new locations for the vertices of the construct will be entered into the GRVT just as in any other case.

The relative referencing feature of the invention comes into play at this point. During the creation of the Macro file, the user designated some of the vertices of the Wide transistor as locater vertices for later placed relative vertices. Now, upon the user's interactive input, the locater vertices have moved to a new location. Fortunately, because the Macro instructions for the relative vertices have been entered using the R-Cell mode, when the processor executes those instructions, it will place the relative vertices properly. This is because;

in the GRVT, the first three entries for the locater vertices, the Series Geometry no., the D-path no. and the Vertex no., have remained the same despite the user's interactive alterations. Only the absolute x and y values have been changed. The processor takes the x and y values of the locater vertices from the GRVT, and calculates the x and y values of the relative vertex using the delta x and delta y in the RELPNT Macro instruction.

As has been mentioned above, the invention may be used advantageously by any designer designing layouts of locations of physical objects. The preferred embodiment of the invention has been described in connection with the design of semiconductor devices, particularly VLSI circuits. It may also be used by engineers laying out logic circuits; ordinary printed circuit design; architects; interior decorators, project managers designing critical path studies, etc. The foregoing description shall not be interpreted as limiting in any way. Additions and deletions and other modifications of the described embodiments will be apparent to those having ordinary skill in the art and are within the scope of the following claims.

Having thus described the invention, I claim:

1. A method for recording, as representations of objects, geometries which are located using a coordinate system, comprising the steps of:
    a. designating the location with respect to said coordinate system of at least one of said geometries;
    b. recording, in an instruction file a record associated with each said at least one geometry for which a location has been designated, each record including the location with respect to said coordinate system of said at least one geometry;
    c. with respect to at least one other geometry, designating as associated a previously designated geometry for which a record has been recorded, said previously designated geometry being a locater geometry;
    d. designating the location of each said other geometry relative to said associated locater geometry, said other geometry being a relative geometry; and
    e. recording in said instruction file a record associated with each said relative geometry, said record including the location of said relative geometry relative to said associated locater geometry.

2. The method of claim 1, further comprising the step of recording, in a datafile, a record associated with each said geometry, each said record including the location with respect to said coordinate system of said geometry.

3. The method of claim 2 further comprising the step of storing said instruction file in a permanent medium.

4. The method of claim 2 further wherein said geometries are defined at least in part with respect to at least one point wherein said designating the location of each at least one geometry step comprises the step of sequentially designating the locations of each point defining said at least one geometry.

5. The method of claim 4 wherein said recording in said datafile step comprises the step of recording a record identifying each point and the location of each point.

6. The method of claim 5 wherein said designating as associated a geometry step comprises the step of designating, for each said relative geometry, at least one of said points defining said locater geometry, said point being an associated locater point.

7. The method of claim 6 wherein said associated locater point designating step comprises the step of, for each point defining said relative geometry, designating as corresponding an associated locater point, each said point defining said relative geometry being a relative point.

8. The method of claim 7 wherein said coordinate system is an x-y Cartesian coordinate system, further wherein said recording in an instruction file the relative location step, for each relative point, comprises the steps of:
    a. retrieving from said datafile the location with respect to said coordinate system of said corresponding, associated locater point;
    b. calculating a displacement in the Cartesian x direction between said relative point and said corresponding, associated locater point;
    c. calculating a displacement in the Cartesian y direction between said relative point and said corresponding, associated locater point; and
    d. creating a command in said instruction file identifying said corresponding, associated locater point and specifying the calculated displacements in the Cartesian x and y directions between said relative point and said corresponding, associated locater point.

9. The method of claim 7 wherein said recording in an instruction file the relative location step, for each relative point, comprises the steps of:
    a. retrieving from said datafile the location with respect to said coordinate system of said corresponding, associated locater point;
    b. calculating a displacement between said relative point and said corresponding, associated locater point; and
    c. recording a command in said instruction file identifying said corresponding, associated locater point and specifying the displacement between said relative point and said corresponding, associated locater point.

10. The method of claim 9 wherein said calculating the displacement step comprises the steps of:
    a. calculating the magnitude of the displacement between said relative point and said corresponding, associated locater point; and
    b. calculating the direction of the displacement between said relative point and said corresponding, associated locater point.

11. A method for recording, as representations of objects, geometries defined, at least in part, with respect to at least one point which is located using a coordinate system, comprising the steps of:
    a. designating the location with respect to said coordinate system of at least one of said geometries by sequentially designating the locations of each said defining point;
    b. recording in an instruction file a record associated with each said at least one geometry for which a location has been designated, each record including the location with respect to said coordinate system of each said defining point of said at least one geometry;
    c. with respect to at least one other geometry, designating as associated at least one of said defining point of said previously designated geometry for which a record has been recorded, said defining point being a locater point and said previously designated geometry being a locater geometry;

d. designating the location of each said other geometry relative to at least one associated locater point, said other geometry being a relative geometry; and e. recording in said instruction file a record associated with each said relative geometry, said record including the location with respect to said coordinate system of said relative geometry.

12. The method of claim 11, further comprising the step of recording, in a datafile, a record associated with each said defining point, each record including the location with respect to said coordinate system of said point.

13. The method of claim 12 wherein said coordinate system is an x-y Cartesian coordinate system, further wherein, for each point defining said relative geometry, each said point defining said relative geometry being a relative point, said recording in an instruction file the relative location step comprises the steps of:

a. designating as corresponding an associated locater point;

b. retrieving from said datafile the location with respect to said coordinate system of said corresponding, associated locater point;

c. calculating a displacement in the Cartesian x direction between said relative point and said corresponding, associated locater point;

d. calculating a displacement in the Cartesian y direction between said relative point and said corresponding, associated locater point;

e. creating a command in said instruction file identifying said corresponding, associated locater point and specifying the calculated displacements in the Cartesian x and y directions between said relative point and said corresponding, associated locater point.

14. The method of claim 12 wherein, for each point defining said relative geometry, each said point defining said relative geometry being a relative point, said recording in an instruction file the relative location step, comprises the steps of:

a. designating as corresponding an associated locater point;

b. retrieving from said datafile the location with respect to said coordinate system of said corresponding, associated locater point;

c. calculating a displacement between said relative point and said corresponding, associated locater point; and d. recording a command in said instruction file identifying said corresponding, associated locater point and specifying the calculated displacement between said locater point and said corresponding, associated locater point.

15. The method of claim 14 further comprising the steps of:

a. altering the location included in the record associated with at least one locater geometry; and b. executing the instructions in the instruction file as instructions for recording, as representations of objects, the geometries, whereby the relative displacement between each altered locater geometry and the relative geometry with respect to which the altered locater geometry is associated remains unchanged.

16. An apparatus for recording, as representations of objects, geometries which are located using a coordinate system, comprising:

a. means for designating the location with respect to said coordinate system of at least one of said geometries;

b. means for recording, in an instruction file, a record associated with each said at least one geometry for which a location has been designated, each record including the location with respect to said coordinate system of said at least one geometry;

c. means for, with respect to at least one other geometry, designating as associated a previously designated geometry for which a record has been recorded, said previously designated geometry being a locater geometry;

d. means for designating the location of each said other geometry relative to said associated locater geometry, said other geometry being a relative geometry; and e. means for recording in said instruction file a record associated with each said relative geometry, said record including the location of said relative geometry relative to said associated locator geometry.

17. The apparatus of claim 16, further comprising means for recording, in a datafile, a record associated with each said geometry, each said record including the location with respect to said coordinate system of said geometry.

18. The apparatus of claim 17 further comprising means for storing said instruction file in a permanent medium.

19. The apparatus of claim 17 further wherein said geometries are defined, at least in part, with respect to at least one point wherein said means for designating the location of each at least one geometry comprises means for sequentially designating the locations of each of the point defining said at least one geometry.

20. An apparatus for recording, as representations of objects, geometries defined, at least in part with respect to at least one point, which is located using a coordinate system, comprising:

a. means for designating the location with respect to said coordinate system of at least one of said geometries using means for sequentially designating the locations of each said defining point;

b. means for recording in an instruction file a record associated with each said at least one geometry for which a location has been designated, each record including the location with respect to said coordinate system of each said defining point of said at least one geometry;

c. means for, with respect to at least one other geometry, designating as associated at least one of said defining points of said previously designated geometry for which a record has been recorded, said defining point being a locater point and said previously designated geometry being a locater geometry;

d. means for designating the location of each said other geometry relative to at least one associated locater point, said geometry being a relative geometry; and e. means for recording, in said instruction file, a record associated with each said relative geometry, said record including the location with respect to said coordinate system of said relative geometry.

21. A method for a user to interactively record, as representations of objects constituting elements making up a semiconductor chip having at least one layer, geometries, defined, at least in part, with respect to at least one point, which is located using a coordinate system, comprising the steps of:
  a. designating the location with respect to the coordinate system of at least one of the geometries by sequentially designating the locations of each defining point;
  b. recording, in an instruction file, a record associated with each geometry for which a location has been designated, each record including the location with respect to the coordinate system of each defining point of the geometry;
  c. with respect to at least one other geometry; designating as associated at least one of the defining points of a previously designated geometry for which a record has been recorded, the defining point being a locater point and the previously designated geometry being a locater geometry;
  d. designating the location of each other geometry relative to at least one associated locater point, the geometry being a relative geometry;
  e. recording in the instruction file a record associated with each relative geometry, the record including the location relative to the associated locater point of the relative geometry;
  f. altering the location included in the record associated with at least one locater geometry and
  g. executing the instructions in the instruction file as instructions for recording, as representations of objects, the geometries, whereby the relative displacement between each altered locater geometry and the relative geometry with respect to which the altered locater geometry is associated remains unchanged.

22. The method of claim 21, further comprising the step of recording, in a datafile, a record associated with each geometry, each record including the location with respect to the coordinate system of the geometry after conducting the step of executing the instructions in the instruction file, the datafile designated an executed macro datafile.

23. The method of claim 22 further comprising the steps of:
  a. providing a means for a visible display;
  b. displaying, upon the display means, a graphical representation of the coordinate system;
  c. providing means for prompting the user to input instructions; and
  d. providing means for accepting instructions input by the user.

24. The method of claim 23 wherein the step of providing instruction accepting means further comprise the step of providing means for locating a cursor with respect to the representation of the coordinate system.

25. The method of claim 24, wherein the step of designating the location of a locater geometry comprises the steps of:
  a. inputting a user instruction by sequentially locating the cursor with respect to the coordinate system at the location of each point defining the locater geometry; and
  b. displaying the locater geometry with the display means.

26. The method of claim 25, wherein spatial design rules exist with respect to the relative locations between relative geometries and locater geometries, further comprising the steps of:
  a. evaluating the locations of the geometries to confirm conformance with the spatial design rules; and
  b. conducting the following steps i-iii until confirming conformance with the spatial design rules:
    i. altering the location included in the record associated with a locater geometry;
    ii. executing the instructions in the instruction file as instructions for recording, as representations of objects, the geometries, whereby the relative displacement between each altered locater geometry and the relative geometry with respect to which the altered locater geometry is associated remains unchanged; and
    iii. evaluating the locations of the geometries to confirm conformance with the spatial design rules.

27. The method of claim 26 wherein each evaluating the locations of geometries step comprises:
  a. providing a real time design rule checker; and
  b. running the real time design rule checker.

28. The method of claim 25 further comprising the steps of:
  a. providing a process definition file containing records, each record defining a representation of a specified object type as a group of at least one object, each object of the group represented by a separate geometry, each separate geometry being a construct geometry; and
  b. for at least one located geometry, designating as associated an object type for which a record exists in the process definition file.

29. The method of claim 28 wherein the step of designating an object type comprises inputting a user instruction specifying the object type.

30. The method of claim 29, wherein the semiconductor chip has more than one layer and the providing a process definition file step comprises providing at least one record defining a representation of an object type, as a group of objects wherein at least two objects of the group are located on different layers of the semiconductor chip.

31. The method of claim 29, further comprising the step of, for each object having an associated object type, displaying the group of construct geometries.

32. The method of claim 31, further comprising providing means associated with said display means for displaying geometries representing objects located on different layers of the semiconductor chip.

33. The method of claim 25, wherein the step of designating an associated locater geometry comprises inputting a user instruction by locating the cursor at a location associated with the locater geometry.

34. The method of claim 33, wherein the step of designating the location of the relative geometry comprises the steps of:
  a. inputting a user instruction by sequentially locating the cursor with respect to the coordinate system at the location of each point defining the relative geometry; and
  b. displaying the relative geometry with the display means.

35. The method of claim 34 wherein the providing means for accepting instructions input from the user step comprises the step of providing a computer terminal keyboard.

36. The method of claim 35, wherein the providing means for accepting instructions input from the user step further comprises the step of providing a hand operated computer mouse, having at least one control input mechanism associated therewith.

37. A method for recording, as representations of objects, geometries which are located using a coordinate system, comprising the steps of:
   a. designating the location with respect to said coordinate system of at least one of said geometries;
   b. recording, in an instruction file a record associated with each said at least one geometry for which a location has been designated, each record including the location with respect to said coordinate system of said at least one geometry;
   c. with respect to at least one other geometry, designating as associated a previously designated geometry for which a record has been recorded, said previously designated geometry being a locater geometry;
   d. designating with an interactive graphics display the location of each said other geometry relative to said associated locater geometry, said other geometry being a relative geometry; and
   e. recording in said instruction file a record associated with each said relative geometry, said record including the location of said relative geometry relative to said associated locater geometry.

38. An apparatus for recording, as representations of objects, geometries defined, at least in part with respect to at least one point, which is located using a coordinate system, comprising:
   a. means for designating the location with respect to said coordinate system of at least one of said geometries using means for sequentially designating the locations of each said defining point;
   b. means for recording in an instruction file a record associated with each said at least one geometry for which a location has been designated, each record including the location with respect to said coordinate system of each said defining point of said at least one geometry;
   c. means for, with respect to at least one other geometry, designating as associated at least one of said defining points of said previously designated geometry for which a record has been recorded, said defining point being a locater point and said previously designated geometry being a locater geometry;
   d. an interactive graphics display for designating the location of each said other geometry relative to at least one associated locater point, said geometry being a relative geometry; and
   e. means for recording, in said instruction file, a record associated with each said relative geometry, said record including the location with respect to said coordinate system of said relative geometry.

* * * * *